US011382228B2

(12) United States Patent
Chen et al.

(10) Patent No.: US 11,382,228 B2
(45) Date of Patent: Jul. 5, 2022

(54) DUAL-AXIS HINGE ASSEMBLIES

(71) Applicant: HEWLETT-PACKARD DEVELOPMENT COMPANY, L.P., Spring, TX (US)

(72) Inventors: Wei-Chung Chen, Taipei (TW); Kuan-Ting Wu, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/481,866

(22) PCT Filed: Apr. 4, 2018

(86) PCT No.: PCT/US2018/025978
§ 371 (c)(1),
(2) Date: Jul. 30, 2019

(87) PCT Pub. No.: WO2019/194796
PCT Pub. Date: Oct. 10, 2019

(65) Prior Publication Data
US 2021/0337687 A1 Oct. 28, 2021

(51) Int. Cl.
H05K 5/00 (2006.01)
H05K 5/02 (2006.01)
H05K 7/18 (2006.01)
G06F 1/16 (2006.01)

(52) U.S. Cl.
CPC .......... *H05K 5/0226* (2013.01); *H05K 7/183* (2013.01); *G06F 1/1681* (2013.01)

(58) Field of Classification Search
None
See application file for complete search history.

(56) References Cited

U.S. PATENT DOCUMENTS

| 6,519,812 B2 * | 2/2003 | Ko ....................... H04N 5/2251 16/354 |
| 7,418,766 B2 | 9/2008 | Nelson et al. |
| 7,586,739 B2 | 9/2009 | Weksler et al. |
| 7,724,511 B2 | 5/2010 | Jacobs |
| 8,749,969 B2 | 6/2014 | Yang et al. |
| 8,912,913 B2 | 12/2014 | Martins |

(Continued)

FOREIGN PATENT DOCUMENTS

JP  H10319852 A  12/1998

*Primary Examiner* — Anthony Q Edwards
*Assistant Examiner* — Rashen E Morrison
(74) *Attorney, Agent, or Firm* — Global IP Services PLLC

(57) ABSTRACT

A dual-axis hinge assembly may include a casing defining a first slot and a second slot. Further, the dual-axis hinge assembly may include a first shaft and a second shaft received through the first and second slots, respectively. The first shaft and the second shaft may engage with a first housing and a second housing of an electronic device. Furthermore, dual-axis hinge assembly may include a foldable linkage disposed in the casing and connected between the first shaft and the second shaft. Furthermore, dual-axis hinge assembly may include an elastic member connected to the foldable linkage. The foldable linkage and the elastic member may enable the first shaft and the second shaft to slide along the first slot and the second slot to variably adjust a distance between a pivot axis of the first housing and a pivot axis of the second housing.

15 Claims, 8 Drawing Sheets

(56) References Cited

U.S. PATENT DOCUMENTS

| | | | |
|---|---|---|---|
| 8,938,856 B1 | 1/2015 | Shin et al. | |
| 8,943,649 B2* | 2/2015 | Chen | G06F 1/1681 16/320 |
| 9,115,750 B2* | 8/2015 | Park | G06F 1/1637 |
| 9,342,101 B2* | 5/2016 | Hsu | G06F 1/1679 |
| 9,442,533 B2* | 9/2016 | Lee | E05D 3/06 |
| 9,606,578 B2* | 3/2017 | Yuan | G06F 1/1681 |
| 9,677,308 B1* | 6/2017 | Chen | G06F 1/1681 |
| 9,846,458 B2 | 12/2017 | Kinoshita et al. | |
| 9,856,909 B1* | 1/2018 | Hsu | E05D 3/122 |
| 10,015,897 B1* | 7/2018 | Hong | G09F 9/301 |
| 10,227,808 B2* | 3/2019 | Siddiqui | G06F 1/1641 |
| 10,296,044 B2* | 5/2019 | Siddiqui | F16C 11/04 |
| 10,365,686 B2* | 7/2019 | Tucker | G06F 1/1618 |
| 10,480,227 B1* | 11/2019 | Chen | E05D 3/122 |
| 10,558,245 B2* | 2/2020 | Morrison | G06F 1/1618 |
| 10,641,318 B2* | 5/2020 | Siddiqui | G06F 1/1616 |
| 2001/0055197 A1 | 12/2001 | Agata et al. | |
| 2007/0213000 A1* | 9/2007 | Day | H05K 7/20754 361/695 |
| 2008/0055846 A1* | 3/2008 | Clidaras | H05K 7/2079 361/679.41 |
| 2008/0109995 A1* | 5/2008 | Kuwajima | H04M 1/022 16/354 |
| 2009/0013500 A1* | 1/2009 | Ueyama | G06F 1/1616 16/354 |
| 2009/0070961 A1* | 3/2009 | Chung | E05D 3/122 16/354 |
| 2009/0144934 A1* | 6/2009 | Kitagawa | G06F 1/1616 16/320 |
| 2009/0216381 A1* | 8/2009 | Gooch | A62C 3/16 700/277 |
| 2010/0058557 A1* | 3/2010 | Wang | G06F 1/1616 16/320 |
| 2010/0071157 A1* | 3/2010 | Wang | G06F 1/1681 16/297 |
| 2010/0232096 A1 | 9/2010 | Chen | |
| 2011/0157780 A1* | 6/2011 | Wang | G06F 1/1681 361/679.01 |
| 2011/0307102 A1* | 12/2011 | Czamara | H05K 7/1497 700/282 |
| 2011/0316337 A1* | 12/2011 | Pelio | H05K 7/1492 307/24 |
| 2012/0042473 A1* | 2/2012 | Wang | G06F 1/1681 16/319 |
| 2012/0092811 A1* | 4/2012 | Chapel | G06F 11/3051 361/622 |
| 2012/0096678 A1* | 4/2012 | Zhang | G06F 1/1681 16/302 |
| 2012/0192381 A1* | 8/2012 | Zhang | G06F 1/1681 16/366 |
| 2012/0255710 A1* | 10/2012 | Maselli | E04H 5/02 165/80.2 |
| 2013/0003278 A1 | 1/2013 | Hayashi et al. | |
| 2013/0077041 A1* | 3/2013 | Chih | G02C 5/146 351/116 |
| 2014/0146484 A1* | 5/2014 | Chen | G06F 1/1679 361/728 |
| 2014/0211380 A1* | 7/2014 | Tsai | G06F 1/1681 361/679.01 |
| 2015/0009614 A1* | 1/2015 | Tsai | G06F 1/1616 361/679.27 |
| 2015/0309541 A1* | 10/2015 | Horng | E05D 11/0054 16/250 |
| 2016/0021793 A1* | 1/2016 | Chen | H05K 7/202 361/679.02 |
| 2016/0097227 A1* | 4/2016 | Hsu | F16B 1/00 16/354 |
| 2016/0132075 A1 | 5/2016 | Tazbaz | |
| 2016/0187937 A1* | 6/2016 | Ahee | A45C 13/005 361/679.09 |
| 2017/0013729 A1 | 1/2017 | Rothkopf et al. | |
| 2017/0013745 A1* | 1/2017 | Wilcox | H05K 7/1492 |
| 2017/0235337 A1* | 8/2017 | Vic | E05D 11/00 361/679.55 |
| 2017/0275935 A1* | 9/2017 | Shang | E05D 3/12 |
| 2017/0359917 A1* | 12/2017 | Bailey | H05K 7/1485 |
| 2019/0166703 A1* | 5/2019 | Kim | G06F 1/1681 |
| 2019/0171799 A1* | 6/2019 | Crawford | H05K 7/1495 |
| 2019/0261534 A1* | 8/2019 | Jochim | H05K 7/1492 |
| 2020/0146186 A1* | 5/2020 | Fotouh | E04B 2/7401 |
| 2020/0265175 A1* | 8/2020 | Martin | G06F 3/04845 |
| 2021/0076529 A1* | 3/2021 | Pachoud | H01R 24/20 |
| 2021/0219460 A1* | 7/2021 | Bailey | H05K 7/1481 |

* cited by examiner

DUAL-AXIS HINGE ASSEMBLIES

BACKGROUND

Electronic devices such as laptop computers, tablet computers, personal digital, assistants (PDAs), flip mobile phones, and the like may include a main housing, a display housing, and a hinge assembly mounted between the main housing and the display housing. For example, the main housing may house a keyboard, a motherboard, and/or other components. The display housing may house a display. The hinge assembly may connect the display housing to the main housing and allow the display housing to rotate relative to the main housing.

BRIEF DESCRIPTION OF THE DRAWINGS

Examples are described in the following detailed description and in reference to the drawings, in which.

DETAILED DESCRIPTION

Hinged electronic devices, such as laptop computers, tablet computers, personal digital assistants (PDAs), and flip mobile phones, may include a main housing and a display housing connected by a hinge. The hinge can be a double-axis construction wherein two shafts are separately attached to the device parts and a coupling is engaged with the two shafts to allow the shafts to be used as two pivot axes. The main housing may house a keyboard and the display housing may house a display. In a closed position or 360° open position, the two pivot axes may be fixed and positioned even with the plane of contact between the main housing and the display housing. In such cases, the display housing, the display, and/or a keyboard portion may be damaged when a user accidentally puts a stationery in-between the display housing and the main housing while closing the display housing or opening the display housing at 360°.

Examples described herein may provide a dual-axis hinge assembly for an electronic device. The dual-axis hinge assembly may include a casing defining a first slot and a second slot. Further, the dual-axis hinge assembly may include a first shaft and a second shaft received through the first slot and the second slot, respectively. The first shaft and the second shaft may engage with a first housing (e.g., display housing) and a second housing (e.g., keyboard housing) of an electronic device to pivotably connect the first housing to the second housing. Furthermore, the dual-axis hinge assembly may include a foldable linkage disposed in the casing, and connected between the first shaft and the second shaft. In addition, the dual-axis hinge assembly may include an elastic member connected to the foldable linkage. In one example, the foldable linkage and the elastic member may enable the first shaft and the second shaft to slide along the first slot and the second slot to variably adjust a distance between a pivot axis of the first housing and a pivot axis of the second housing.

For example, the foldable linkage and the elastic member may enable the first shaft and the second shaft to slide along the first slot and the second slot when a force exerted during closure of the display housing is greater than a fixed force of the elastic member. Similarly, the elastic member may enable the first shaft and the second shaft to slide along the first slot and the second slot when a force exerted during opening of the display housing at 360° is greater than a fixed force of the elastic member.

Examples described herein may increase the distance between the pivot axis of the first housing and the pivot axis of the second housing to prevent any damage when the first housing is closed relative to the second housing with an object present in-between, thereby saving maintenance cost.

Figure 1A:
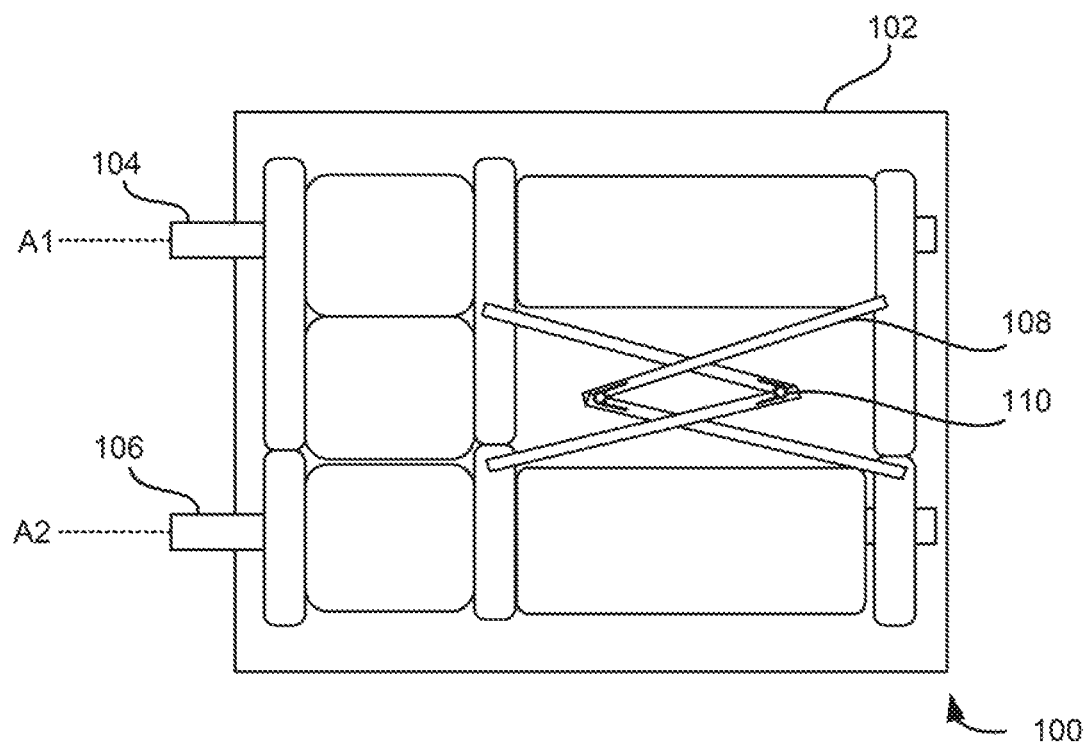
FIGS. 1A and 1B illustrate cross-sectional front views of an example dual-axis hinge assembly, depicting a foldable linkage connected between a first shaft and a second shaft.
Figure 1B:
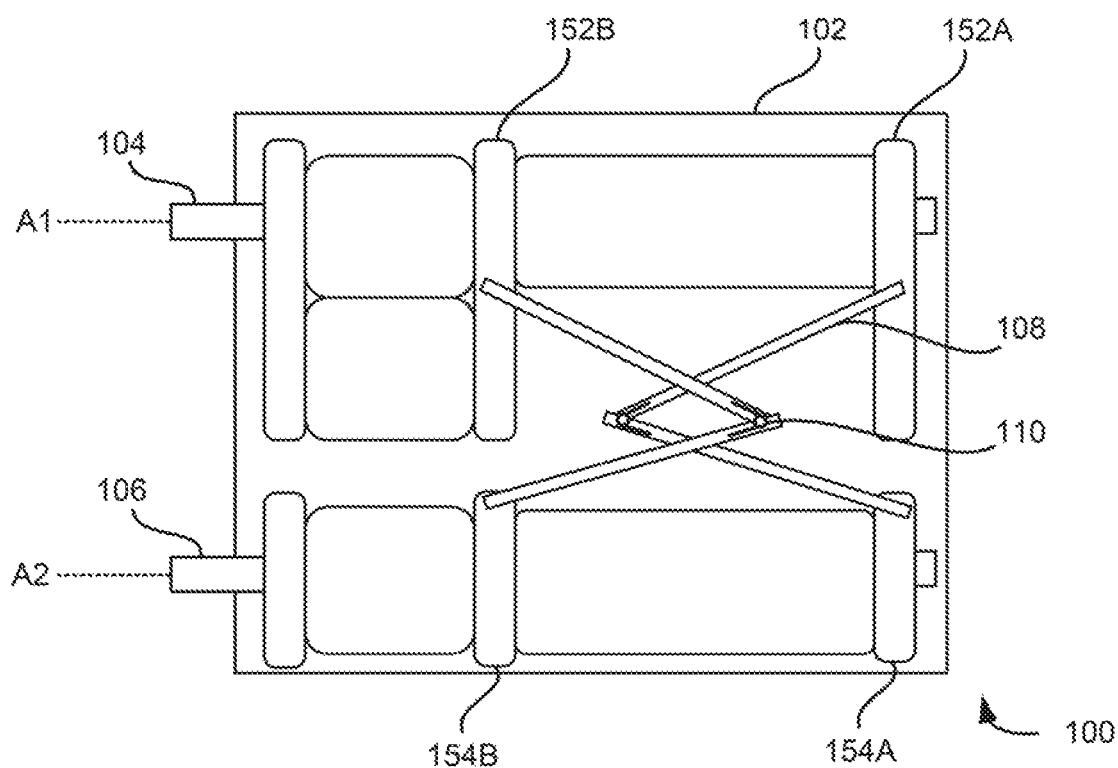

FIGS. 1A and 1B illustrate cross-sectional front views of an example dual-axis hinge assembly 100, depicting a foldable linkage 108 connected between a first shaft 104 and a second shaft 106. Particularly, FIG. 1A illustrates a cross-sectional front view of example dual-axis hinge assembly 100, depicting foldable linkage 108 in a retracted position. FIG. 1B illustrates a cross-sectional front view of example dual-axis hinge assembly 100, depicting foldable linkage 108 in an extended position to increase a distance between a pivot axis (A1) of a first housing and a pivot axis (A2) of a second housing.

Figure 2A:
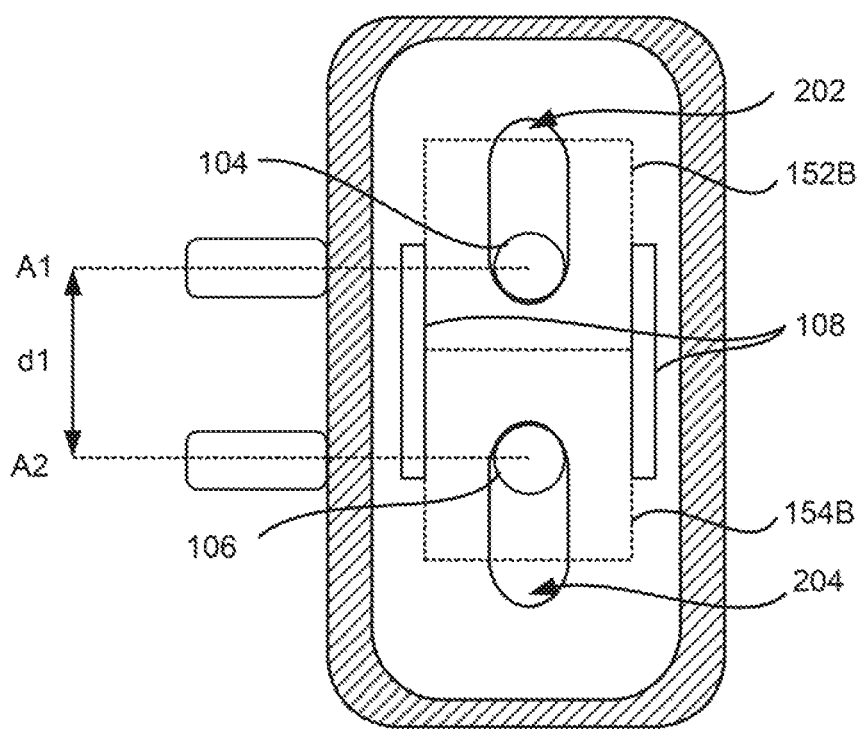
FIGS. 2A and 2B illustrate cross-sectional left-side views of the example dual-axis hinge assembly of FIGS. 1A and 1B, respectively, depicting sliding movement of the first shaft and the second shaft along a first slot and a second slot.
Figure 2B:
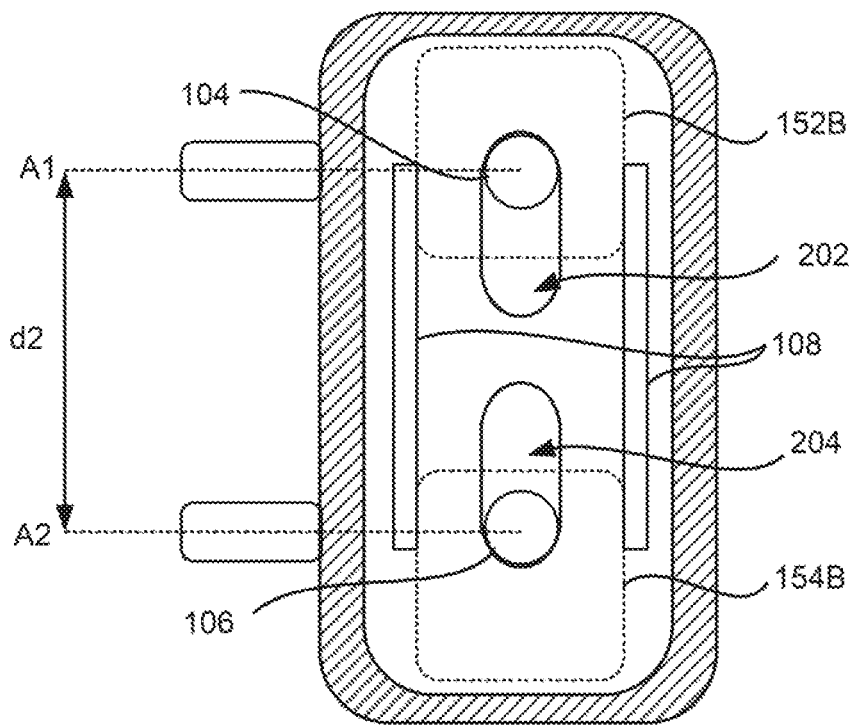

Example dual-axis hinge assembly 100 may include a casing 102 defining a first slot and a second slot (e.g., a first slot 202 and a second slot 204 as shown in FIGS. 2A and 2B). In one example, casing 102 may be formed using a single-piece structure. In another example, casing 102 may be formed by a hinge cap and a pair of hinge brackets connected to the hinge cap at both sides such that the first slot and the second slot are defined in a first hinge bracket of the pair of hinge brackets. An example casing 102 is explained in FIG. 6B.

Further, dual-axis hinge assembly 100 may include first shaft 104 and second shaft 106 received through the first slot and the second slot, respectively. In one example, first shaft 104 and second shaft 106 may engage with a respective one of the first housing and the second housing of an electronic device to pivotably connect the first housing to the second housing. In one example, one end of first shaft 104 and second shaft 106 may protrude out of a respective one of the first slot and the second slot (e.g., on one side of casing 102) and fixedly engage with a corresponding one of the first housing and the second housing while other end of first shaft 104 and second shaft 106 may be disposed within an opposite side of casing 102.

Example dual-axis hinge assembly 100 may include a foldable linkage 108 disposed in casing 102. Foldable linkage 108 may be connected between first shaft 104 and second shaft 106. Example foldable linkage 108 may include a scissor mechanism. Example scissor mechanism may use folding links that are linked in a crisscross 'X' pattern. In other words, scissor mechanism may include intersecting links that are pivotally connected at an intermediate location. An example foldable linkage may be explained in FIGS. 7A and 7B.

Further, dual-axis hinge assembly 100 may include an elastic member 110 connected to foldable linkage 108. Example elastic member 110 may be a spring. Example spring may be a torsion spring connected between the links of foldable linkage 108 at a pivot joint. In other examples, any other type of spring can be connected between the links of foldable linkage 108 such that the spring can fold or collapse foldable linkage 108 in a relaxed state.

In one example, foldable linkage 108 and elastic member 110 may enable first shaft 104 and second shaft 106 to slide along the first slot and the second slot to variably adjust a distance between pivot axis (A1) of the first housing and pivot axis (A2) of the second housing, as shown in FIG. 1B.

As shown in FIG. 1B, dual-axis hinge assembly 100 may include a first pair of support rails 152A and 152B disposed on first shaft 104. Further, dual-axis hinge assembly 100 may include a second pair of support rails 154A and 154B disposed on second shaft 106. In one example, foldable linkage 108 may be connected between first shaft 104 and second shaft 106 via first pair of support rails 152A and 152B and second pair of support rails 154A and 154B.

FIGS. 2A and 2B illustrate cross-sectional left-side views of example dual-axis hinge assembly 100 of FIGS. 1A and 1B, respectively, depicting sliding movement of first shaft 104 and second shaft 108 along first slot 202 and second slot 204. Particularly, FIG. 2A illustrates a cross-sectional left-side view of example hinge assembly 100 of FIG. 1A, depicting a look position of first shaft 104 and second shaft 106 at respective inmost ends of first slot 202 and second slot 204. FIG. 2B illustrates a cross-sectional left-side view of example hinge assembly 100 of FIG. 1B, depicting sliding movement of first shaft 104 and second shaft 106 to respective outmost ends of first slot 202 and second slot 204. For example, similarly named elements of FIGS. 2A and 2B may be similar in structure and/or function to elements described with respect to FIGS. 1A and 1B. The term "inmost ends" may correspond to a minimum distance between first shaft 104 and second shaft 106 and "outmost ends" may correspond to a maximum distance between first shaft 104 and second shaft 106.

In one example, elastic member (e.g., elastic member 110 as shown in FIGS. 1A and 1B) may retract foldable linkage 108 to lock a position of first shaft 104 and second shaft 106 at respective inmost ends of first slot 202 and second slot 204 when the first housing is closed or opened at 360° relative to the second housing with no object disposed in-between (e.g., as shown in FIG. 2A). In this example, the distance between A1 and A2 may be d1. In another example, elastic member (e.g., elastic member 110 as shown in FIGS. 1A and 1B) may enable foldable linkage 108 to extend such that first shaft 104 and second shaft 106 can slide along first slot 202 and second slot 204 towards respective outmost ends when the first housing is closed or opened at 360° relative to the second housing with an object in-between (e.g., as shown in FIG. 2B). In this example, the distance between A1 and A2 may be d2, where d2>d1. In the example shown in FIG. 2B, support rail 152B and support rail 154B may move away from each other.

Figure 3A:
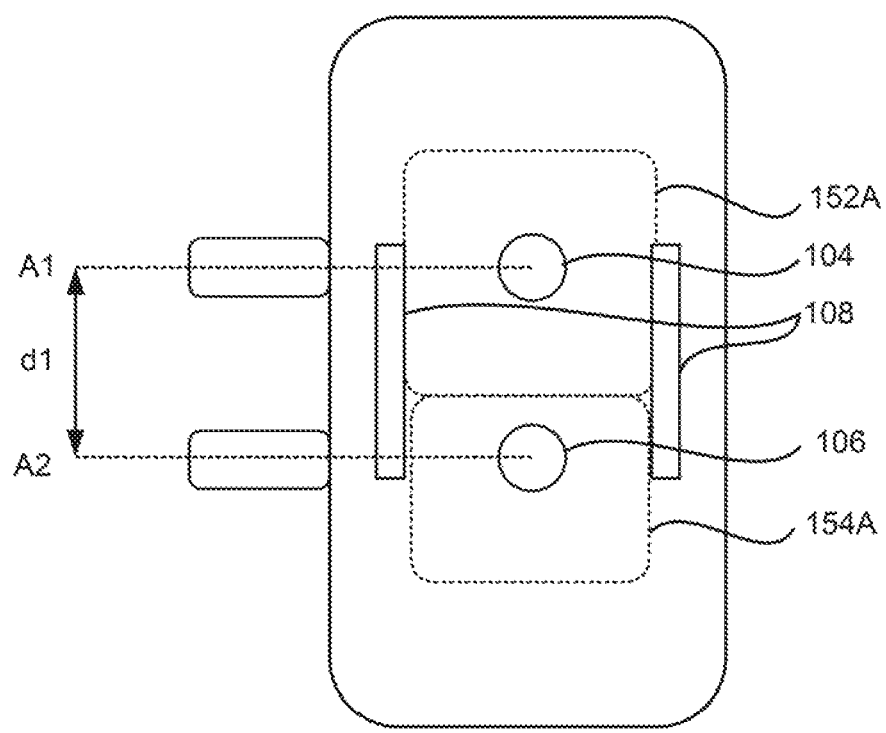
FIGS. 3A and 3B illustrate cross-sectional right-side views of the example dual-axis hinge assembly of FIGS. 1A and 1B, respectively.
Figure 3B:
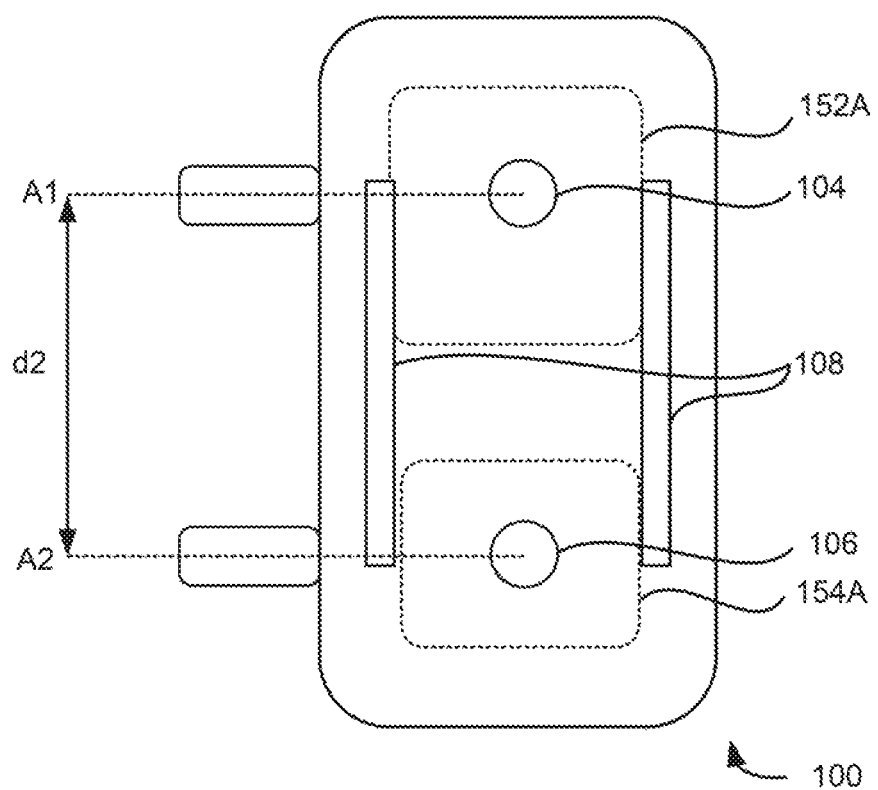

FIGS. 3A and 3B illustrate cross-sectional right-side views (e.g., opposite to the left-side views as shown in FIGS. 2A and 2B) of example dual-axis hinge assembly 100 of FIGS. 1A and 1B, respectively. Particularly, FIG. 3A may correspond to FIG. 2A, depicting foldable linkage 108 in a retracted position. FIG. 3B may correspond to FIG. 2B, depicting foldable linkage 108 in an extended position to increase the distance between pivot axis (A1) of the first housing and pivot axis (A2) of a second housing (e.g., from d1 to d2). In some examples, a pair of foldable linkages (e.g., 108) may be connected between first shaft 104 and second shaft 106 via opposite sides of support, rails 152A, 152B, 154A, and 154B (e.g., as shown in FIGS. 2A, 2B, 3A, and 3B). As shown in FIG. 3B, the distance between support rail 152A and support rail 154A may be increased, for instance, when the first housing is closed or opened at 360° relative to the second housing with the object in-between.

Figure 4A:
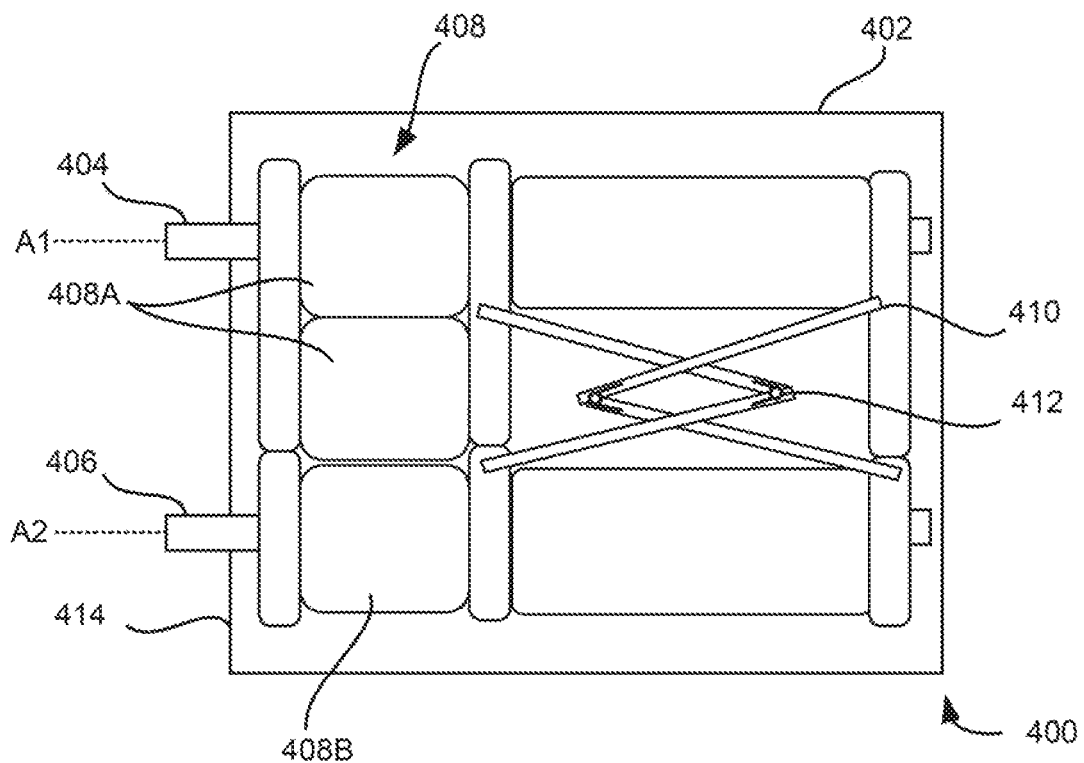
FIGS. 4A and 4B illustrate cross-sectional front views of an example hinge assembly, depicting a foldable linkage and a gear unit connected between a first shaft and a second shaft.
Figure 4B:
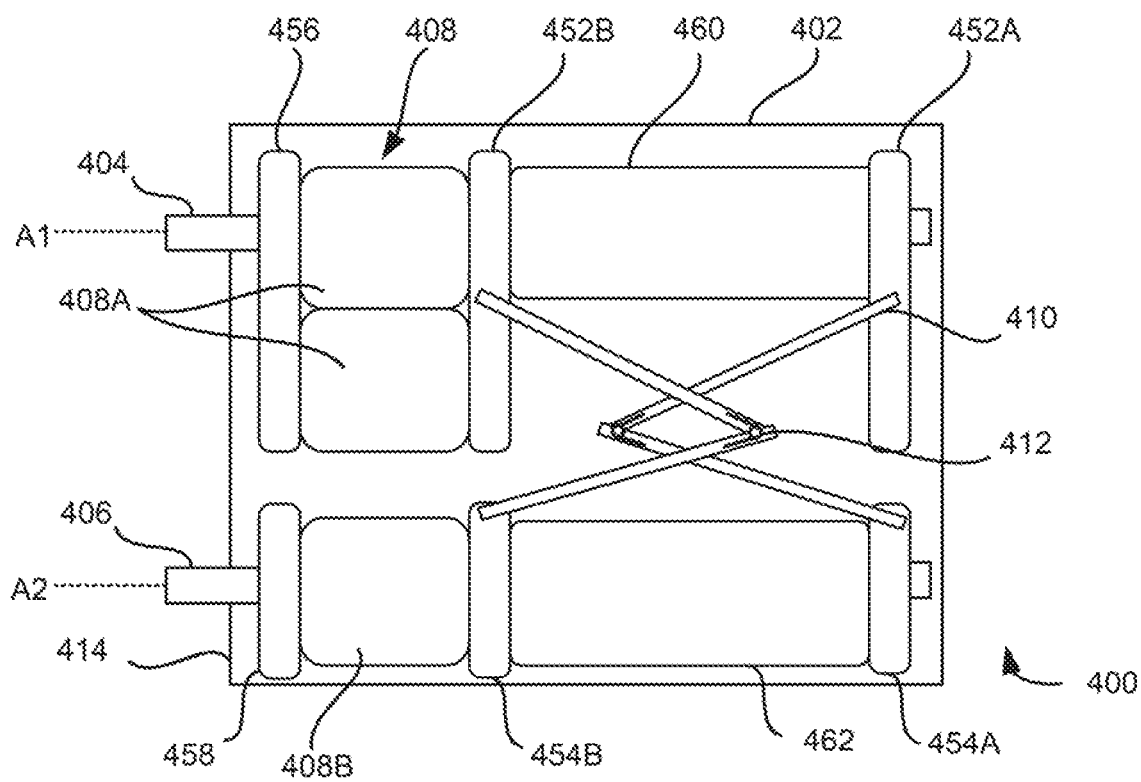

FIGS. 4A and 4B illustrate cross-sectional front views of an example hinge assembly 400, depicting a foldable linkage 410 and a gear unit 408 connected between a first shaft 404 and a second shaft 406. Example hinge assembly 400 may include a casing 402 defining a first slot and a second slot in a side wall 414.

Figure 5A:
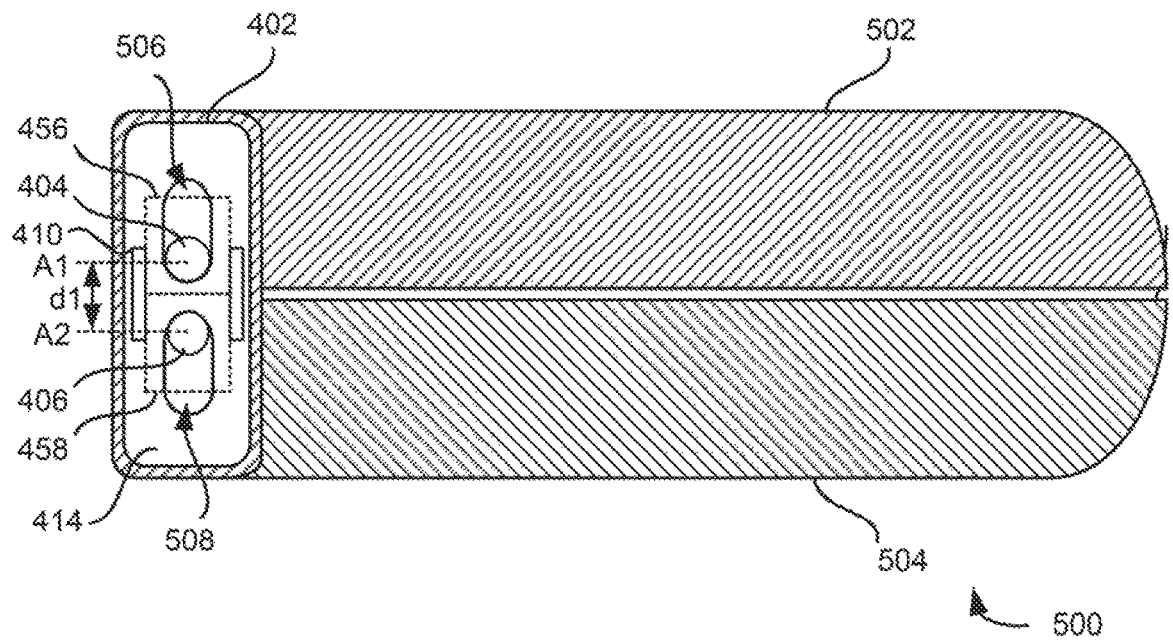
FIGS. 5A and 5B illustrate cross-sectional side views of an example electronic device, depicting variably adjusting a distance between a pivot axis of a first housing and a pivot axis of a second housing.
Figure 5B:
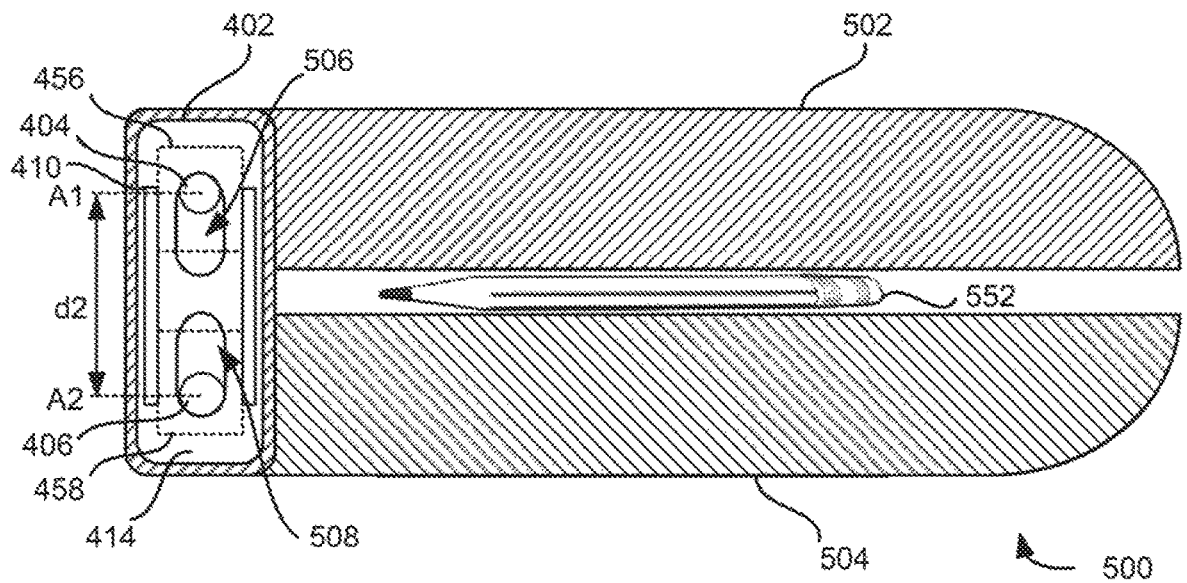

Example hinge assembly 400 may include first shaft 404 and second shaft 406 received through the first and second slots, respectively. In one example, first shaft 404 and second shaft 406 may engage with a display housing and a main housing of an electronic device (e.g., as shown in FIGS. 5A and 5B).

Further, example hinge assembly 400 may include gear unit 408 connected between first shaft 404 and second shaft 406 to enable synchronous rotation between first shaft 404 and second shaft 406. In one example, gear unit 408 may enable first shaft 404 and second shaft 406 to rotate in a synchronous manner in reverse directions upon rotating the first housing with respect to the second housing (e.g., while opening and/or closing of the first housing relative to the second housing).

As shown in FIG. 4A, gear unit 408 may include a first gear portion 408A disposed on first shaft 404 and a second gear portion 408B disposed on second shaft 406. As shown in FIG. 4B, hinge assembly 400 may include a third support rail 456 to hold first gear portion 408A and a forth support rail 458 to hold second gear portion 408B such that first gear portion 408A is to physically engage with second gear portion 408B during operation of the electronic device (e.g., when the display housing is rotated relative to the base housing). An example gear unit 408 is explained in FIGS. 7A and 7B.

Furthermore, example hinge assembly 400 may include foldable linkage 410 connected between first shaft 404 and second shaft 406. Also, example hinge assembly 400 may include a spring 412 connected between links of foldable linkage 410. As shown in FIG. 4B, example hinge assembly 400 may include a first pair of support rails 452A and 452B disposed on first shaft 404 and a second pair of support rails 454A and 454B disposed on second shaft 406. In this example, foldable linkage 410 may be connected between first and second shafts 404 and 406 via first pair of support rails 452A and 452B and second pair of support rails 454A and 454B.

During operation, foldable linkage 410 and spring 412 may enable first shaft 404 and second shaft 406 to slide along the first and second slots to variably adjust a distance between a pivot axis (A1) of the display housing and a pivot axis (A2) of the main housing via disengaging first gear portion 408A and second gear portion 408B, as shown in FIG. 48. This is explained in FIGS. 5A and 5B. In this example, first gear portion 408A may disengage with second gear portion 4088 when the first and second shafts 404 and 406 slide along the first and second slots to increase the distance between pivot axis (A1) and pivot axis (A2), for instance, when the display housing is closed relative to the base housing with an object in-between.

In other examples, dual-axis hinge assembly 400 may include a first torque engine 460 connected to first shaft 404. In the example shown in FIG. 4B, first torque engine 460 may be disposed between first pair of support rails 452A and 452B. Further, dual-axis hinge assembly 400 may include a second torque engine 462 connected to second shaft 406. In the example shown in FIG. 4B, second torque engine 462 may be disposed between second pair of support rails 454A and 454B. First torque engine 460 and second torque engine 462 may provide friction resistance between the display housing and the main housing during pivoting motion.

FIGS. 5A and 5B illustrate cross-sectional side views of an example electronic device 500, depicting variably adjusting a distance between a pivot axis (A1) of display housing 502 and a pivot axis (A2) of main housing 504. Main housing 504 may be connected to display housing 502 by hinge assembly 400 as shown in FIGS. 4A and 4B. For example, similarly named elements of FIGS. 5A and 5B may be similar in structure and/or function to elements described with respect to FIGS. 4A and 4B.

Hinge assembly 400 may include a casing 402 defining a first slot 506 and a second slot 508 in side wall 414 (e.g., a hinge bracket). Further, first shaft 404 may be fixedly engaged with display housing 502. Second shaft 406 may be fixedly engaged with main housing 504.

During operation, foldable linkage 410 and spring 412 (e.g., as shown in FIGS. 4A and 4B) may enable first shaft 404 and second shaft 406 to slide along first slot 506 and second slot 508 to increase the distance between pivot axis (A1) and pivot axis (A2) when a force exerted during closure or 360° opening of display housing 502 is greater than a fixed force of spring 412. In this example, first shaft 404 and second shaft 406 may slide along first slot 506 and second slot 508 by torsion or twisting of spring 412 (e.g., torsion spring) when the force exerted on display housing 502 is greater than the fixed force of spring 412. In other examples, first shaft 404 and second shaft 406 may slide along first slot 506 and second slot 508 by stretching spring 412 depending on a type of spring 412 connected to foldable linkage 410.

For example, a display of display housing 502 may abut against keyboard in main housing 504 when the display is closed, relative to main housing 504. As shown in FIG. 5A, a distance between pivot axis A1 and pivot axis A2 is d1, when display housing 502 is closed relative to main housing 504 with no object disposed in-between.

As shown in FIG. 5B, foldable linkage 410 and spring 412 (e.g., as shown in FIGS. 4A and 4B) may enable first shaft 404 and second shaft 406 to slide along first slot 506 and second slot 508 to increase the distance (i.e., d2, where d2>d1) between pivot axis A1 and pivot axis A2 when display housing 502 is closed relative to main housing 504 with an object 552 (e.g., a pen, pencil, data card, and the like) in-between. In this example, when display housing 502 physically touches/contacts object 552 during closure of display housing 502 and when the force exerted during closure of display housing 502 is greater than the fixed force of spring 412, then spring 412 may be twisted or stretched to increase the distance between pivot axis A1 and pivot axis A2 (e.g., increased distance between support rail 456 and support rail 458 as shown in FIG. 5B) via foldable linkage 410.

Similarly, foldable linkage 410 and spring 412 (e.g., as shown in FIGS. 4A and 4B) may enable first shaft 404 and second shaft 406 to slide along first slot 506 and second slot 508 to increase the distance between pivot axis A1 and pivot axis A2 when display housing 502 is opened 360° relative to main housing 504 with object 552 in-between. When the closing force on display housing 502 is released (i.e., force exerted is less than the fixed force of spring 412), then spring 412 may be returned to a relaxed state, thereby bringing the distance between pivot axis A1 and pivot axis A2 to a normal distance, i.e., d1.

In one example, a diameter of first shaft 404 and second shaft 406 can be less than a length of first slot 506 and second slot 508, respectively, to enable sliding movement of first shaft 404 and second shaft 406. Further, first shaft 404 may include a first bracket to fixedly secure first shaft 404 to display housing 502 and second shaft 406 may include a second bracket to fixedly secure second shaft 406 to main housing 504. An example electronic device is explained in FIGS. 6A-6D.

Figure 6A:
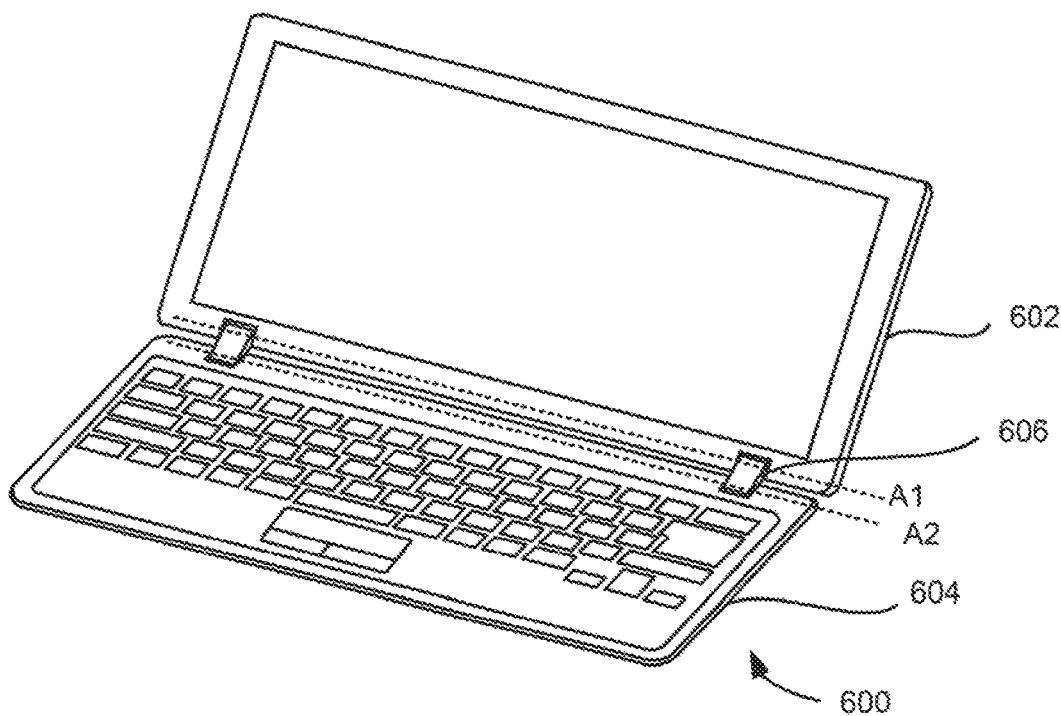
FIG. 6A is a perspective view of an example electronic device including an example hinge assembly to variably adjust a distance between a pivot axis of a display housing and a pivot axis of a main housing.

FIG. 6A is a perspective view of an example electronic device 600 including a hinge assembly 606 to variably adjust a distance between a pivot axis of a first housing 602 (e.g., a display housing) and a pivot axis of a second housing 604 (e.g., a main housing). Electronic device 600 may include second housing 604 and first housing 602 connected to second housing 604 via hinge assembly 606. Hinge assembly 606 may be similar to hinge assembly 100 as shown in FIGS. 1A and 1B. Example electronic device 600 may be a computing system, for example, a laptop, a convertible device, a PDA, a notebook, a sub-notebook, a mobile telephone, a personal gaming device, or other computing device with first housing 602 closeable onto second housing 604. Example convertible device may refer to a device that can be "converted" from a laptop mode to a tablet mode. In the tablet mode, first housing 602 may be closed with a display facing up and viewable, i.e., first housing 602 may be substantially parallel to and adjacent to second housing 604 with the display viewable.

For example, second housing 604 may house a keyboard, a battery, a touchpad, and so on. First housing 602 may house a display (e.g., touch-screen display). Example display may include liquid crystal display (LCD), light emitting diode (LED), electro-luminescent (EL) display, or the like. Electronic device 600 may be equipped with other components such as a camera, audio/video devices, and the like, depending on the functions of electronic device 600. Hinge assembly 606 may be pivotally connected to first housing 602 along a first pivot axis (A1) and second housing 604 along a second pivot axis (A2). Hinge assembly 606 may allow first housing 602 to rotate in directions about rotational axis relative to second housing 604, for instance, between 0° to 360°.

Figure 6B:
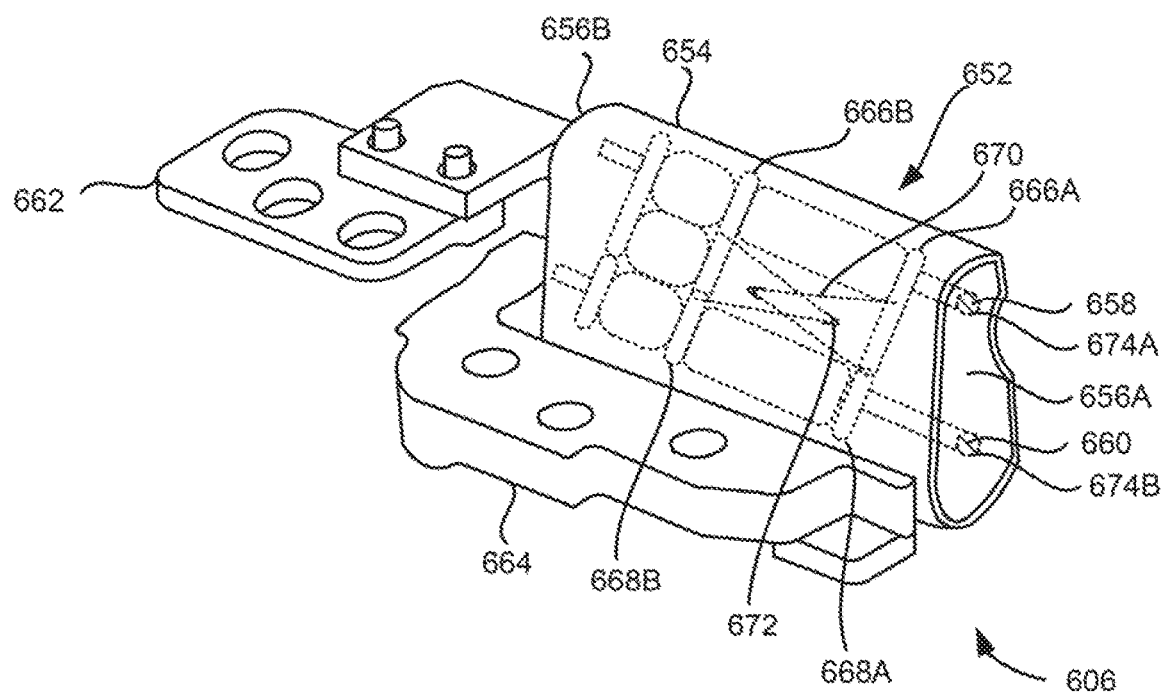
FIG. 6B is a schematic view of the example hinge assembly of FIG. 6A, depicting additional features.
Figure 6C:
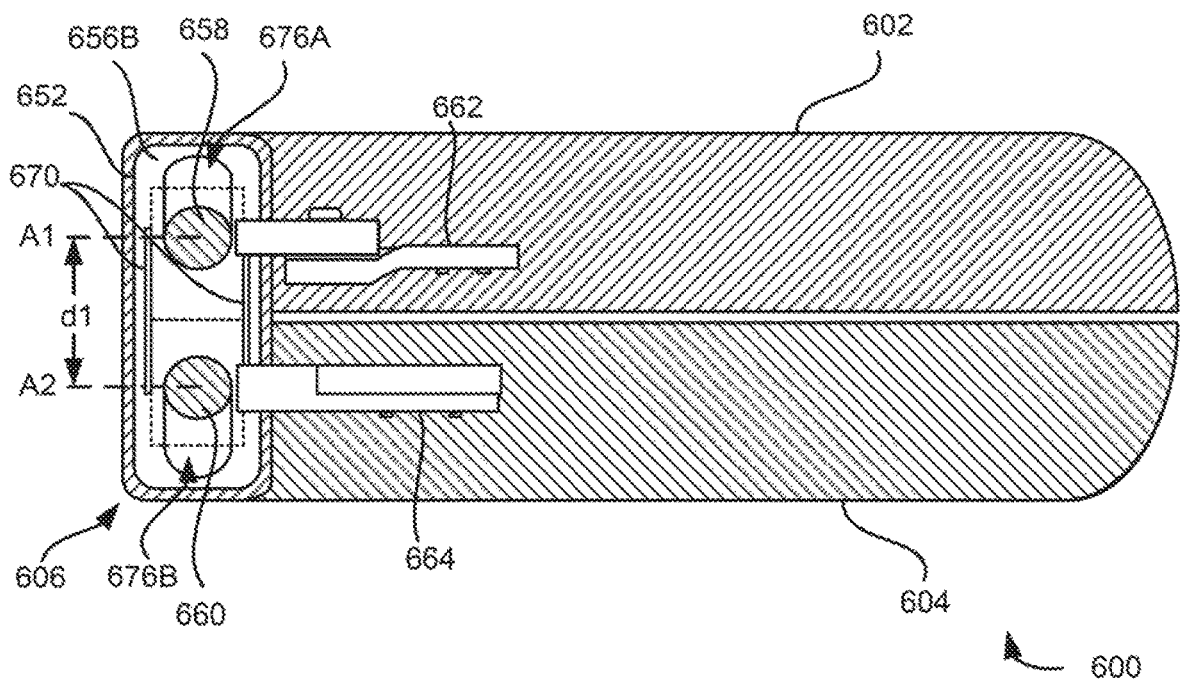
FIGS. 6C and 6D illustrate cross-sectional side views of the example electronic device of FIG. 6A in a closed position, showing additional features.
Figure 6D:
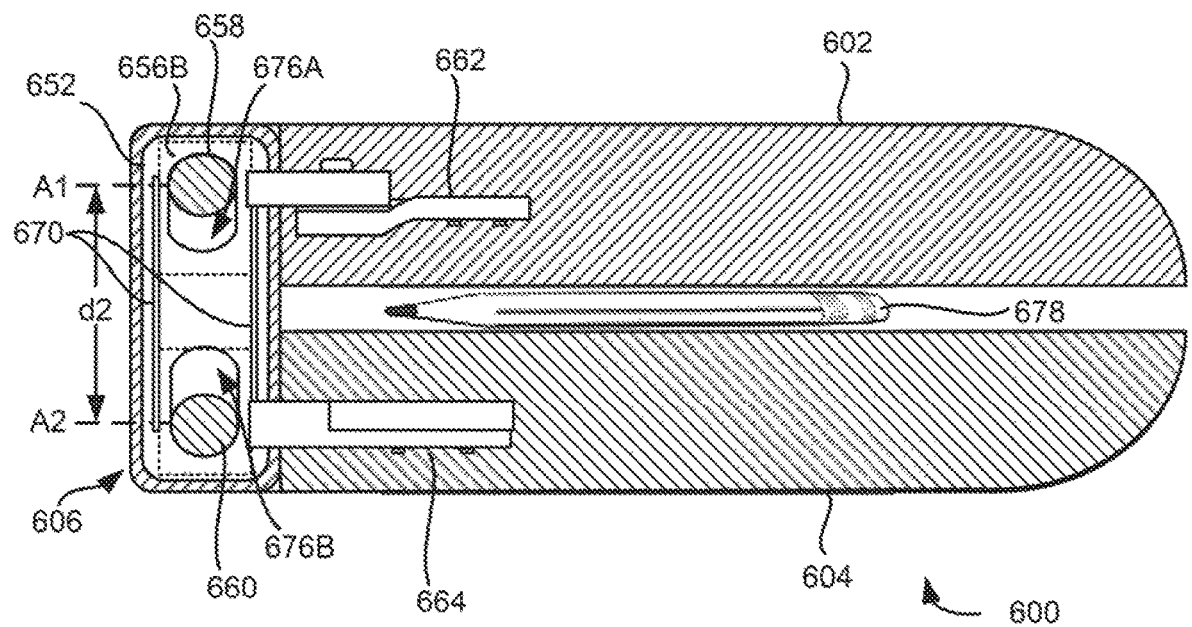

FIG. 68 is a schematic view of example hinge assembly 606 of FIG. 6A, depicting additional features. Hinge assembly 606 may include a casing 652 defining a pair of slots (e.g., slots 676A and 676B as shown in FIGS. 6C and 6D) in a hinge bracket 656B. In one example, casing 652 may be formed by a hinge cap 654 and a pair of hinge brackets 656A and 656B connected to hinge cap 654 at both sides such that slots 676A and 676B may be defined in hinge bracket 656B.

Hinge assembly 606 may include t shaft 658 and second shaft 660 received through first slot 676A and second slot 676B, respectively. Further, first shaft 658 may be engaged with first housing 602 along first pivot axis A1 and second shaft 660 may be engaged with second housing 604 along second pivot axis A.

Further, first shaft 658 may include a first bracket 662 to fixedly engage first shaft 658 to first housing 602 and second shaft 660 may include a second bracket 664 to fixedly engage second shaft 660 to second housing 604. First housing 602 can be moved relative to second housing 604 in response to rotation of first housing 602 about hinge assembly 606.

Furthermore, hinge assembly 606 may include a first pair of support rails 666A and 666B and a second pair of support rails 668A and 668B disposed on first shaft 658 and second shaft 660, respectively. Also, hinge assembly 606 may include a foldable linkage 670 connected between first shaft 658 and second shaft 660 via the first and second pairs of support rails 666A, 6668, 668A, and 668B.

Further, hinge assembly 606 may include a spring 672 connected to foldable linkage 670. In one example, foldable linkage 670 and spring 672 may enable first shaft 658 and second shaft 660 to slide along first slot and second slot, respectively, to vary a distance between first pivot axis (A1) and second pivot axis (A2), as shown in FIGS. 6C and 6D.

FIGS. 6C and 6D illustrate cross-sectional side views of example electronic device 600 in a closed position, showing additional features. For example, similarly named elements of FIGS. 6C and 6D may be similar in structure and/or function to elements described with respect to FIG. 6B. As shown in FIGS. 6C and 6D, an end of first shaft 658 may protrude out of casing 652 through first slot 676A and fixedly couple with first housing 602 via first bracket 662, for instance, using screws. Further as shown in FIGS. 6C and 6D, an end of second shaft 660 may protrude out of casing 652 through second slot 676B and fixedly couple with second housing 604 via second bracket 664, for instance, using screws. Other end of first and second shafts 658 and 660 may engage with hinge bracket 656A of casing 652 (e.g., as shown in FIG. 6B). For example, as shown in FIG. 6B, hinge bracket 656A may include a pair of openings 674A and 674B (e.g., as shown in FIG. 6B) to accommodate/hold other end of shafts 658 and 660, respectively.

In one example, spring 672 (e.g., as shown in FIG. 6B) may retract foldable linkage 670 to lock a position of first and second shafts 658 and 660 at respective inmost ends of slots 676A and 676B when first housing 602 is closed relative to second housing 604 with no object disposed in-between (e.g., as shown in FIG. 6C). In another example, spring 672 (e.g., as shown in FIG. 68) may enable foldable linkage 670 to extend such that first and second shafts 658 and 660 can slide along slots 676A and 676B to variably adjust a distance between first pivot axis A1 and second pivot axis A2. For example, shafts 658 and 660 can slide along slots 676A and 676B to increase the distance between first pivot axis A1 and second pivot axis A2 when first housing 602 is closed relative to second housing 604 with an object 678 disposed in-between (e.g., as shown in FIG. 6D).

In this example, first and second shafts 658 and 660 may slide along first and second slots 676A and 676B, respectively, to increase the distance between first pivot axis A1 and second pivot axis A2 when display side of first housing 602 touches the object 678 during closure of first housing 602 and force exerted during closure of first housing 602 is greater than a fixed force of spring 672. Examples described herein can also be used in other hinge structures provided that the distance between first pivot axis A1 and second pivot axis A2 can be adjusted via a foldable linkage and a spring when first housing 602 is closed or opened at 360° relative to second housing 604 with an object in-between.

Figure 7A:
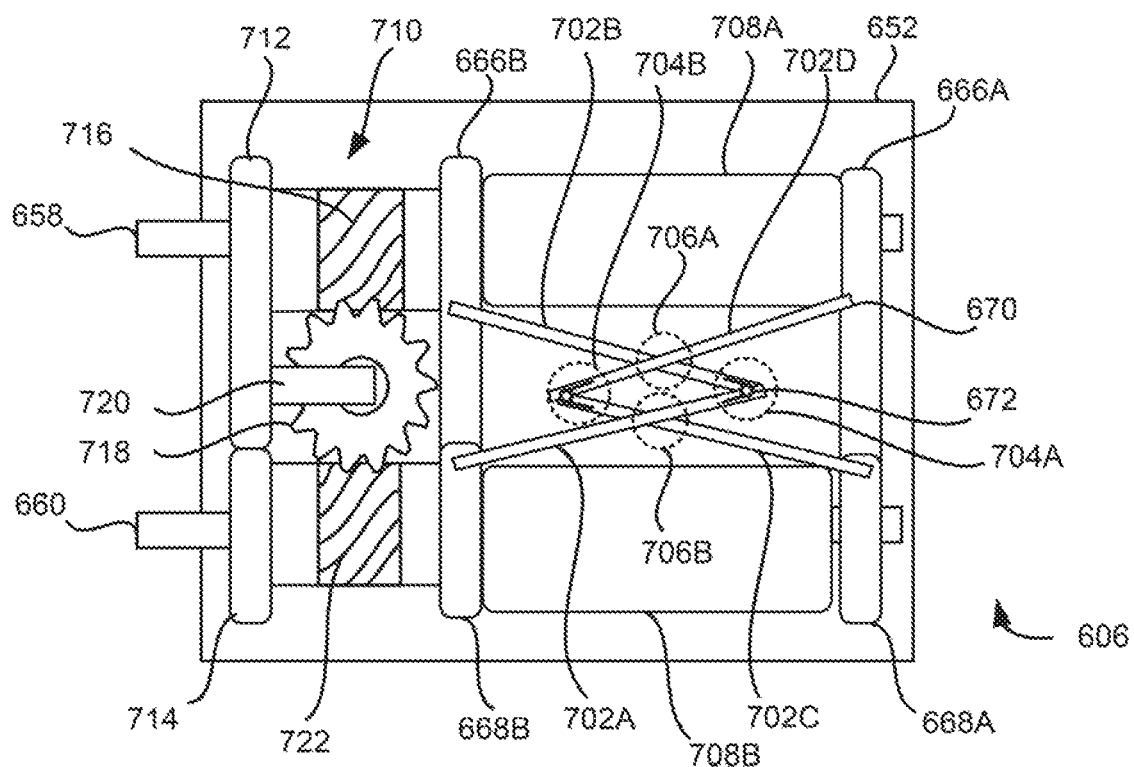
FIGS. 7A and 7B illustrate cross-sectional front views of an example hinge assembly, depicting an example gear unit connected between a first shaft and a second shaft.
Figure 7B:
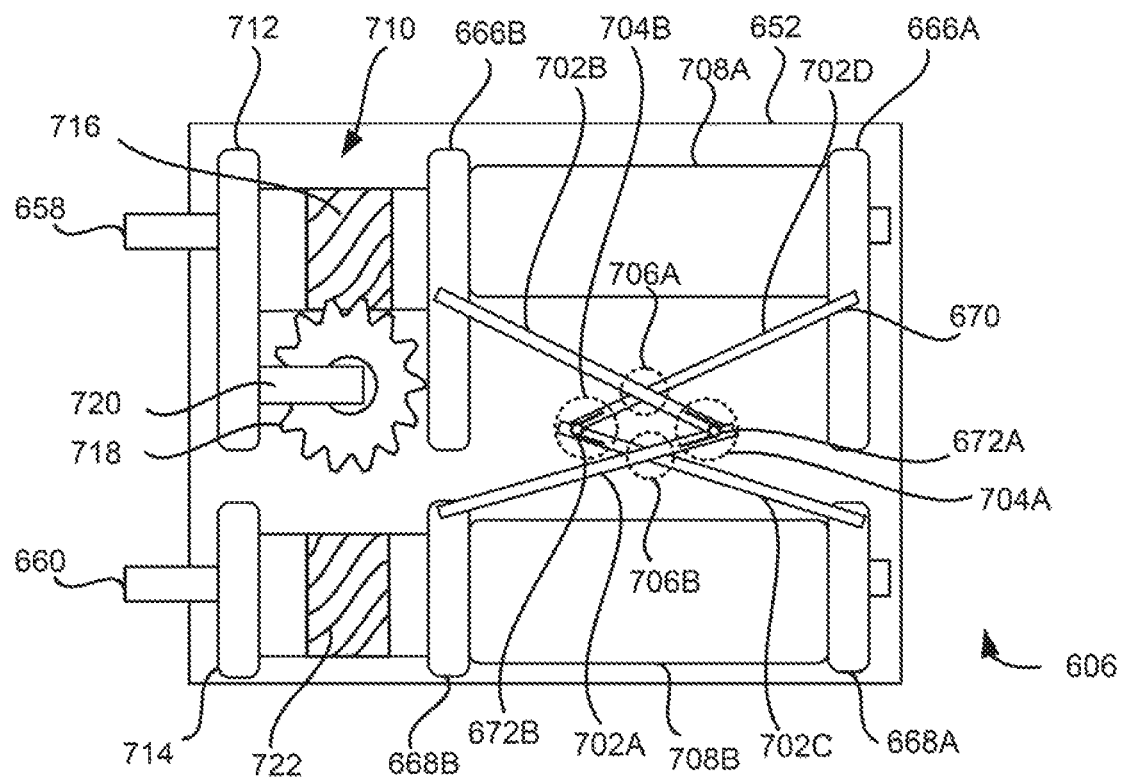

FIGS. 7A and 7B illustrate cross-sectional front views of an example hinge assembly 606, depicting an example gear unit connected between a first shaft 658 and a second shaft 660. For example, similarly named elements of FIGS. 7A and 7B may be similar in structure and/or function to elements described with respect to FIGS. 6B to 6D. As shown in FIGS. 7A and 7B, foldable linkage 670 may include intersecting links 702A-702D that are pivotally connected at an intermediate location. For example, foldable linkage 670 may be formed of intersecting links 702A and 702B that are connected at a pivot joint 704A and intersecting links 702C and 702D that are connected at a pivot joint 7048. Further, intersecting links 702A and 702C may be connected at an intermediate location 7068 and intersecting links 702B and 7020 may be connected at an intermediate location 706A. In some, examples, a first spring 672A may be connected at pivot joint 704A and a second spring 672B may be connected at pivot joint 704B to bring foldable linkage 670 to a retracted position, in a relaxed state.

Further, hinge assembly 606 may include a first torque engine 708A connected to first shaft 658. Further, hinge assembly 606 may include a second torque engine 708B connected to second shaft 660. First torque engine 708A and second torque engine 708B may provide a frictional resistance between a first housing and a second housing during pivoting motion.

Further, hinge assembly 606 may include a gear unit 710 having a first gear portion and a second gear portion. As shown in FIGS. 7A and 7B, the first gear portion may include a first guide threaded portion 716, a gear wheel 718, and a gear holder 720 to hold gear wheel 718. Further, the second gear portion may include a second guide threaded portion 722. In some examples, gear wheel 718 may engage with first guide threaded portion 716 and second guide threaded portion 722 to enable synchronous rotation between first shaft 658 and second shaft 660 in reverse directions. Further, gear holder 720 may hold gear wheel 718 such that gear wheel 718 may be physically engaged with first guide threaded portion 716 and second guide threaded portion 722.

Hinge assembly 606 may further include a third support rail 712 disposed on first shaft 658 to support the first gear portion (i.e., first guide threaded portion 716, gear wheel 718, and gear holder 720) and a forth support rail 714 disposed on second shaft 660 to support the second gear portion (i.e., second guide threaded portion 722) such that the first gear portion is to engage with the second, gear portion (i.e., gear wheel 718 may be physically engaged with first guide threaded portion 716 and second guide threaded portion 722 as shown in FIG. 7A). In some examples, the first gear portion may disengage with the second gear portion (i.e., gear wheel 718 may be disengaged with second guide threaded portion 722 as shown in FIG. 7B) to increase the distance between the pivot axis of the display housing and the pivot axis of the main housing when the first housing is closed or opened at 360° relative to the second housing with an object in-between.

It may be noted that the above-described examples of the present solution are for the purpose of illustration only. Although the solution has been described in conjunction with a specific embodiment thereof, numerous modifications may be possible without materially departing from the teachings and advantages of the subject matter described herein. Other substitutions, modifications and changes may be made without departing from the spirit of the present solution. All of the features disclosed in this specification (including any accompanying claims, abstract and drawings), and/or all of the steps of any method or process so disclosed, may be combined in any combination, except combinations where at least some of such features and/or steps are mutually exclusive.

The terms "include," "have," and variations thereof, as used herein, have the same meaning as the term "comprise" or appropriate variation thereof. Furthermore, the term "based on," as used herein, means "based at least in part on." Thus, a feature that is described as based on some stimulus can be based on the stimulus or a combination of stimuli including the stimulus.

The present description has been shown and described with reference to the foregoing examples. It is understood, however, that other forms, details, and examples can be made without departing from the spirit and scope of the present subject matter that is defined in the following claims.

What is claimed is:

1. A dual-axis hinge assembly comprising:
   a casing defining a first slot and a second slot;
   a first shaft and a second shaft received through the first slot and the second slot, respectively, wherein the first shaft and the second shaft are to engage with a first housing and a second housing of an electronic device to pivotably connect the first housing to the second housing;
   a gear unit comprising a first gear portion disposed on the first shaft and a second gear portion disposed on the second shaft;
   a foldable linkage disposed in the casing and connected between the first shaft and the second shaft; and
   a spring member connected to the foldable linkage, wherein the foldable linkage and the spring are to enable the first shaft and the second shaft to slide along the first slot and the second slot to variably adjust a distance between a pivot axis of the first housing and a pivot axis of the second housing via disengaging the first gear portion and the second gear portion.

2. The dual-axis hinge assembly of claim 1, further comprising:
   a first pair of support rails disposed on the first shaft; and
   a second pair of support rails disposed on the second shaft, wherein the foldable linkage is connected between the first shaft and the second shaft via the first pair of support rails and the second pair of support rails.

3. The dual-axis hinge assembly of claim 1, wherein the foldable linkage comprises a scissor mechanism, and wherein the spring is a torsion spring connected between links of the foldable linkage at a pivot joint.

4. The dual-axis hinge assembly of claim 1,
   wherein the spring is to retract the foldable linkage to lock a position of the first and second shafts at respective inmost ends of the first and second slots when the first housing is closed or opened at 360° relative to the second housing with no object disposed in-between, and
   wherein the spring is to enable the foldable linkage to extend such that the first and second shafts are to slide along the first and second slots towards respective outmost ends when the first housing is closed or opened at 360° relative to the second housing with an object in-between.

5. The dual-axis hinge assembly of claim 1, wherein the casing is formed by a hinge cap and a pair of hinge brackets connected to the hinge cap at both sides such that the first slot and the second slot are defined in a first hinge bracket of the pair of hinge brackets.

6. A hinge assembly comprising:
   a casing defining a first slot and a second slot in a side wall;
   a first shaft and a second shaft received through the first and second slots, respectively, wherein the first and second shafts are to engage with a display housing and a main housing of an electronic device;
   a gear unit comprising:
      a first gear portion disposed on the first shaft; and
      a second gear portion disposed on the second shaft;
   a foldable linkage connected between the first and second shafts; and
   a spring connected between links of the foldable linkage, wherein the foldable linkage and the spring are to enable the first and second shafts to slide along the first and second slots to variably adjust a distance between a pivot axis of the display housing and a pivot axis of the main housing via disengaging the first and second gear portions.

7. The dual-axis hinge assembly of claim 6, wherein the foldable linkage and the spring are to enable the first and second shafts to slide along the first and second slots to increase the distance between the pivot axis of the display housing and the pivot axis of the main housing when a force exerted during closure or 360° opening of the display housing is greater than a fixed force of the spring.

8. The dual-axis hinge assembly of claim 6, further comprising:
   a first pair of support rails disposed on the first shaft;
   a second pair of support rails disposed on the second shaft, wherein the foldable linkage is connected between the first and second shafts via the first pair of support rails and the second pair of support rails.

9. The dual-axis hinge assembly of claim 8, further comprising:
   a first torque engine connected to the first shaft and disposed between the first pair of support rails; and
   a second torque engine connected to the second shaft and disposed between the second pair of support rails.

10. The dual-axis hinge assembly of claim 6, further comprising:
    a third support rail to hold the first gear portion; and
    a fourth support rail to hold the second gear portion such that the first gear portion is to physically engage with the second gear portion, and wherein the first gear portion is to disengage with the second gear portion when the first and second shafts slide along the first and second slots to increase the distance between the pivot axis of the display housing and the pivot axis of the main housing.

11. The dual-axis hinge assembly of claim 6, wherein a diameter of the first shaft and the second shaft is less than a length of the first slot and the second slot, respectively, to enable sliding movement of the first shaft and the second shaft.

12. An electronic device comprising:
    a first housing;
    a second housing; and
    a hinge assembly pivotally connected to the first housing along a first pivot axis and the second housing along a second pivot axis, the hinge assembly comprising:
       a casing defining first and second slots;

first and second shafts received through the first and second slots, respectively, wherein the first and second shafts are engaged with the first and second housings;

first and second pairs of support rails disposed on the first and second shafts, respectively;

a gear unit comprising a first gear portion disposed on the first shaft and a second gear portion disposed on the second shaft;

a foldable linkage connected between the first and second shafts via the first and second pairs of support rails; and a spring connected to the foldable linkage, wherein the foldable linkage and the spring are to enable the first and second shafts to slide along the first and second slots, respectively, to vary a distance between the first and second pivot axes via disengaging the first gear portion and the second gear portion.

13. The electronic device of claim 12, wherein the hinge assembly further comprises:

a first torque engine connected to the first shaft; and a second torque engine connected to the second shaft, wherein the first torque engine and the second torque engine are to provide a frictional resistance between the first housing and the second housing during pivoting motion.

14. The electronic device of claim 12, wherein the hinge assembly further comprises:

a third support rail disposed on the first shaft to support the first gear portion; and a fourth support rail disposed on the second shaft to support the second gear portion such that the first gear portion is to engage with the second gear portion, and wherein the first gear portion is to disengage with the second gear portion when the first housing is closed or opened at 360° relative to the second housing with an object in-between.

15. The electronic device of claim 12, wherein the first shaft comprises a first bracket to fixedly engage the first shaft to the first housing and the second shaft comprises a second bracket to fixedly engage the second shaft to the second housing.

* * * * *